(12) United States Patent
Karp

(10) Patent No.: US 10,522,531 B1
(45) Date of Patent: Dec. 31, 2019

(54) INTEGRATED CIRCUIT DEVICE AND METHOD OF TRANSMITTING DATA IN AN INTEGRATED CIRCUIT DEVICE

(71) Applicant: Xilinx, Inc., San Jose, CA (US)

(72) Inventor: James Karp, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/154,647

(22) Filed: Oct. 8, 2018

(51) Int. Cl.
| | |
|---|---|
| *H01L 27/02* | (2006.01) |
| *G02B 6/42* | (2006.01) |
| *H04B 10/80* | (2013.01) |
| *H01L 23/60* | (2006.01) |
| *H04B 10/60* | (2013.01) |
| *H04B 10/50* | (2013.01) |
| *H04B 10/40* | (2013.01) |

(52) U.S. Cl.
CPC ........ *H01L 27/0248* (2013.01); *G02B 6/4275* (2013.01); *H01L 23/60* (2013.01); *H04B 10/801* (2013.01); *H04B 10/40* (2013.01); *H04B 10/50* (2013.01); *H04B 10/60* (2013.01)

(58) Field of Classification Search
None
See application file for complete search history.

(56) References Cited

U.S. PATENT DOCUMENTS

| | | |
|---|---|---|
| 6,740,936 B1 | 5/2004 | Gitlin |
| 6,789,959 B1 | 9/2004 | Conn |
| 6,945,712 B1 | 9/2005 | Conn |
| 7,812,674 B2 | 10/2010 | Karp |
| 8,134,813 B2 | 3/2012 | Karp |
| 8,181,140 B2 | 5/2012 | Kireev |
| 8,218,277 B2 | 7/2012 | Li |
| 8,866,229 B1 | 11/2014 | Fakhruddin |
| 8,881,085 B1 | 11/2014 | Karp |
| 8,947,839 B2 | 2/2015 | Karp |
| 8,982,581 B2 | 3/2015 | Karp |
| 9,013,845 B1 | 4/2015 | Karp |
| 9,548,738 B2 | 1/2017 | Karp |

(Continued)

OTHER PUBLICATIONS

J. Karp, et. al, "Interposer FPGA with self-protecting ESD design for inter-die interfaces and its CDM specification", Reliability Physics Symposium (IRPS), Pasadena, CA, USA, IEEE, 2016.

*Primary Examiner* — Darren E Wolf
(74) *Attorney, Agent, or Firm* — John J. King

(57) ABSTRACT

An integrated circuit device is described. The integrated circuit device comprises a substrate having transmitter for receiving a signal to be transmitted to a receiver of the substrate by way of a transmission channel; a first plurality of contacts adapted to receive a first integrated circuit die, wherein a contact of the first plurality of contacts is adapted to receive the signal to be transmitted by the transmitter; a second plurality of contacts adapted to receive a second integrated circuit die, wherein a contact of the second plurality of contacts is adapted to receive the signal transmitted by the transmitter and received by the receiver; a first resistive element coupled between a contact of the first plurality of contacts and the transmitter; and a second resistive element coupled between a contact of the second plurality of contacts and the receiver. A method of transmitting data in an integrated circuit is also described.

20 Claims, 4 Drawing Sheets

(56) References Cited

U.S. PATENT DOCUMENTS

2007/0296055 A1* 12/2007 Yen .................... H01L 23/5227
  257/531
2010/0264954 A1* 10/2010 Drost ................. H01L 23/3171
  326/30

* cited by examiner

INTEGRATED CIRCUIT DEVICE AND METHOD OF TRANSMITTING DATA IN AN INTEGRATED CIRCUIT DEVICE

TECHNICAL FIELD

The present invention relates generally to integrated circuit devices, and in particular, to a method of transmitting data in an integrated circuit device.

BACKGROUND

With the continued efforts to improve integrated circuit devices, such as through decreased size, reduced power, an improved performance for example, changes are always being made, not only to the implementation of the circuits of an integrated circuit device, but also to the packaging of components of an integrated circuit (IC) device. For example, many 3D IC packages are currently available. Silicon Stacked Interconnect Technology (SSIT) is one variant of a 3D package, where a silicon interposer is placed between the package substrate and the IC dies. IC dies mounted on silicon interposer generally have two types of input/output (IO) contacts. A first type of IO contact is a generic IO that directly communicates signals by way of through-silicon vias (TSVs) to the package ball to provide signals external to the device. These IOs are generally required to meet industry component level electrostatic discharge (ESD) specifications.

A second type of IO contact is a type of IO which drives and receives signals only between IC dies via micro bumps and interposer metal traces. That is, these types of IOs are inter-die interfaces that are not connected to package pins, and thus may be considered internal nodes during industry standard ESD qualification testing. ESD protection of these "Die-to-Die" IOs (DTD IOs) is designed to protect them during package assembly, such as during device package assembly for devices having stacked IC die (e.g. 3D/2.5D devices). DTD IOs may be exposed to charged device model (CDM) risks during device package assembly.

Accordingly, there is a need for an integrated circuit for and method of transmitting data in an integrated circuit device that overcomes the problems of conventional integrated circuit devices.

SUMMARY

An integrated circuit device is described. The integrated circuit device comprises a substrate having transmitter for receiving a signal to be transmitter to a receiver of the substrate by way of a transmission channel; a first plurality of contacts adapted to receive a first integrated circuit die and a second integrated circuit die; a first contact of the first plurality of contacts adapted to receive the signal to be transmitted by the transmitter; a second contact of the first plurality of contacts adapted to receive the signal transmitted by the transmitter and received by the receiver; a first resistive element coupled between the first contact and the transmitter; and a second resistive element coupled between the second contact and the receiver.

A method of transmitting data in an integrated circuit device is also described. The method comprises implementing a transmitter in a substrate for receiving a signal to be transmitter to a receiver of the substrate by way of a transmission channel; configuring a first plurality of contacts to receive a first integrated circuit die, wherein a contact of the first plurality of contacts is adapted to receive the signal to be transmitted by the transmitter; configuring a second plurality of contacts to receive a second integrated circuit die, wherein a contact of the second plurality of contacts is adapted to receive the signal transmitted by the transmitter and received by the receiver; coupling a first resistive element between a contact of the first plurality of contacts and the transmitter; and coupling a second resistive element between a contact of the second plurality of contacts and the receiver.

DETAILED DESCRIPTION

The circuits and methods set forth below provide ESD protection for IOs between dies of stacked integrated circuit devices. According to some implementations, The ESD protection is provided in a substrate of the integrated circuit device, such as an interposer or a package substrate for example. One or more resistive elements could be coupled between a contact of a transmitter or a receiver. According to other implementations, the substrate may comprise an optical interposer, and the transmission channel may comprise an optical waveguide, such as a silicon waveguide. For example, the transmitter may comprise a silicon modulator and the receiver may comprise a germanium photodetector. At least one of a first resistor and a second resistor comprises a resistive element formed in the substrate, or may comprise a resistive element having a metal structure. According to some implementations, the resistive elements may be selected to withstand an electrostatic discharge at a first contact of the substrate and at a second contact of the substrate, where the resistive elements may be adapted to withstand an approximately 100 mA, 100 ns electrostatic discharge pulse.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
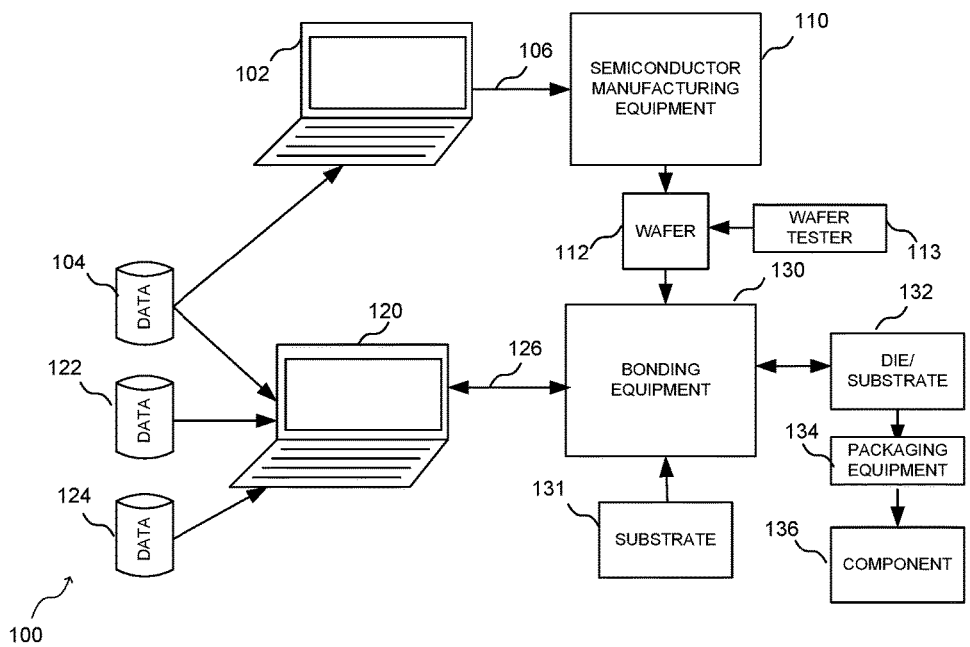
FIG. 1 is a system for producing an integrated circuit device.

Turning first to FIG. 1, a system for producing an integrated circuit device is shown. The system 100 comprises computer-aided design (CAD) equipment 102, which could be any computer adapted to run CAD software. The CAD equipment 102 receives data, such as a master schematic 104 based upon selected values for transistor and interconnect element design, and is coupled by a communication link 106 to semiconductor manufacturing equipment 110. CAD equipment 102 could be used to simulate and determine desired transistor and interconnect element values that improve performance. The semiconductor manufacturing equipment 110 may generate a wafer 112 having a plurality of die, as is well known in the art. A wafer tester 113 may be implemented to test wafers produced by the system before they are packaged in an integrated circuit packaging device.

CAD equipment 120, which is also coupled to receive the master schematic 104, may receive a bonding diagram 122 and substrate artwork 124. The CAD equipment 120 is coupled by a communication link 126 to bonding equipment 130. The communication links 106 and 126 could be any wired or wireless communication link. The bonding equipment provide wire bonds from a die from the wafer 112 to a substrate 131 receiving the die, or may enable contacts, such as solder bumps between contact pads of the die and corresponding contact pads of the substrate. The bonding equipment may also enable direct chip attach arrangements, die-to-die connections, or other types of connections to contact elements of a die. The die/substrate 132 is coupled to packaging equipment 134 which generates a finished component 136, such as an integrated circuit package. The system of FIG. 1 enables the manufacture of an integrated circuit package according to the various circuits and methods set forth above. Although the system of FIG. 1 provides various elements required for producing an integrated circuit package, it should be understood the elements shown in FIG. 1 could be combined, or additional elements could be provided.

Figure 2:
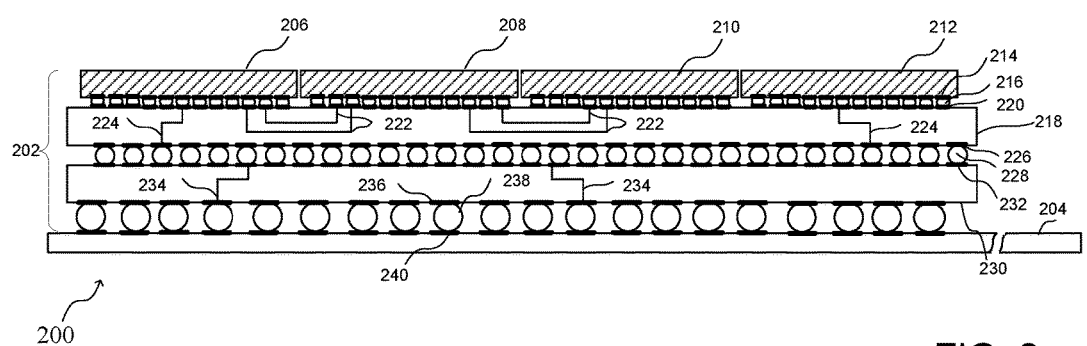
FIG. 2 is a cross-sectional view of an integrated circuit device.

Turning now to FIG. 2, a cross-sectional view of an integrated circuit device 200 attached to a printed circuit board is shown. The exemplary device of FIG. 2 comprises an integrated circuit device 202 on a printed circuit board 204. The integrated circuit device 202 comprises a plurality of IC die, shown here by way of example as IC dies 206-212. Each of the die comprises contacts 214, shown here by way of example as contact pads, where solder bumps 216 are enable the contacts 214 to be coupled to a substrate 218 at corresponding contacts 220, which may also comprise contact pads.

The substrate 218 may be an interposer that is positioned between the dies 206-212 and package substrate 230 of the integrated circuit device 200. The substrate 218 may comprise different types of interconnect elements, including interconnect elements 224 that enable a connection to the first type of IO described above (i.e. a generic IOs that directly communicates signals by way of through-silicon vias (TSVs) to the package ball to provide signals externally). While the interconnect elements 224 are shown by way of example as having vias and interconnect traces using multiple metal layers, it should be understood that the connection between the dies 206-212 and the package substrate could be implemented with a single TSV that extends from the top of the substrate 218 to the bottom of the substrate 218. Interconnect elements 222 enable a second type of IO that drives and receives signals only between IC dies via micro bumps and interposer metal traces. That is, these types of IOs are inter-die interfaces that are not connected to package pins, and may also be formed using interconnect traces in metal layers and vias to enable the routing of signals from a contact element associated with one of the dies 206-212 to a contact element of another of the dies.

The interconnect elements 222 may also include traces formed in metal layers and vias that are used to connect the traces in the metal layers, and may include other elements, such as transmitter, receivers, and transmission lines, as will be described in more detail below. The substrate 218 may also comprise contact elements 226 adapted to receive solder bumps 228 that are coupled to contact elements 232 of the package substrate 230. The package substrate 230 also comprises interconnect elements 234 for providing an electrical connection for the transfer of signals from the contact elements 232 to contact elements 236, which are coupled to solder balls 238 and contact elements 240 of the printed circuit board 204. While the use of interconnect elements that enable the transmission of signals from one die to another die are shown in the substrate 218 that is implemented as an interposer, it should be understood that the ESD protection elements of the circuits and methods set forth below could be implemented in other substrates, such as the package substrate 230 using similar interconnect elements 222. While an example of an integrated circuit device of FIG. 2 is shown, it should be understood the circuits and methods could be implemented with other integrated circuit devices.

Figure 3:
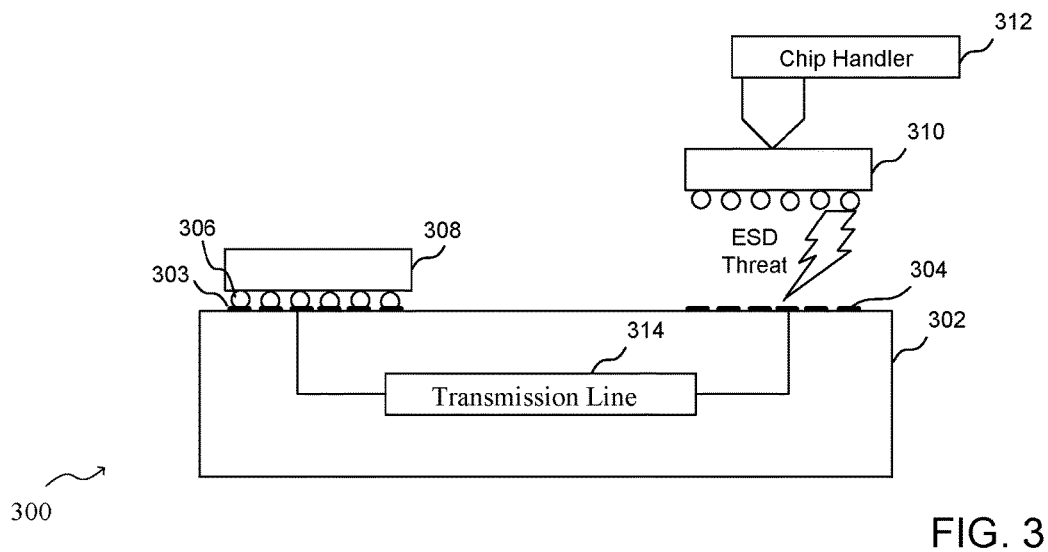
FIG. 3 is a cross-sectional view of an integrated circuit device having a die in the process of being attached by a chip handler.

Turning now to FIG. 3, a cross-sectional view of an integrated circuit device 300 having a die in the process of being attached by a chip handler is shown. A substrate 302 comprises a first plurality of contact elements 303 and a plurality of contact elements 304, shown here as contact pads for receiving solder bumps 306 of dies 308 and 310. As shown in FIG. 3, a chip handler 312 used to place the die 312 on the substrate 302 may provide an ESD threat to an element of the substrate, such as transmission line 314 or other elements that may be implemented in the substrate or electrically connected to the substrate.

Figure 4:
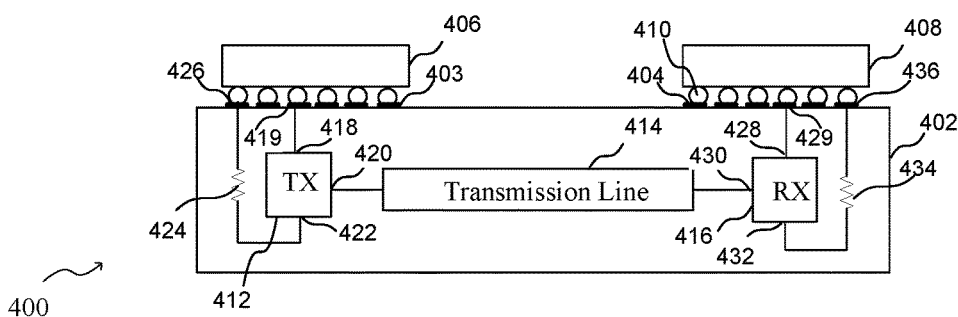
FIG. 4 is a cross-sectional view of an integrated circuit device having a transmitter and a receiver.

The cross-sectional view of FIG. 4 shows an implementation of a portion of an integrated circuit device 400 comprising a substrate having a transmitter and receiver associated with a transmission line, and an ESD protection element associated with one or more contact pads adapted to receive a die. More particularly, a substrate 402 comprises a first plurality of contact elements 403 and a second plurality of contact elements 404, shown here as contact pads, adapted to receive a first die 406 and a second die 408. A transmitter 412 coupled to first die is configured to provide signals by way of a transmission line 414 to a receiver 416 that is coupled to the second die 408 having solder bumps 410. The transmitter 412 comprises an input 418 coupled to the die 406 at a contact element 419, and output 420 for transmitting the data by way of the transmission line 414, and another terminal 422 for coupling the transmitter 412 to the die 406 by way of an ESD protection element 424, shown by way of example as a resistor coupled to a contact pad 426. While the ESD protection element is shown by way of example as a resistor implemented in the substrate, it should be understood that the ESD protection element could be implemented as a metal element such as a metal serpentine structure associated with the metal layers of the substrate. Similarly, the receiver 416 comprises an output 428 that is configured to provide the signal that is received at the input 430 to a contact element 429 of the die 408. Another terminal 432 is provided to another connection to the die 408 by way of another ESD protection element 434, also shown here by way of example as a resistive element 434 coupled to a contact pad 436. The contact pads 426 and 436 could be for example ground contact pads. The ESD protection elements provide an increased impedance to reduce effect of an ESD event.

Figure 5:
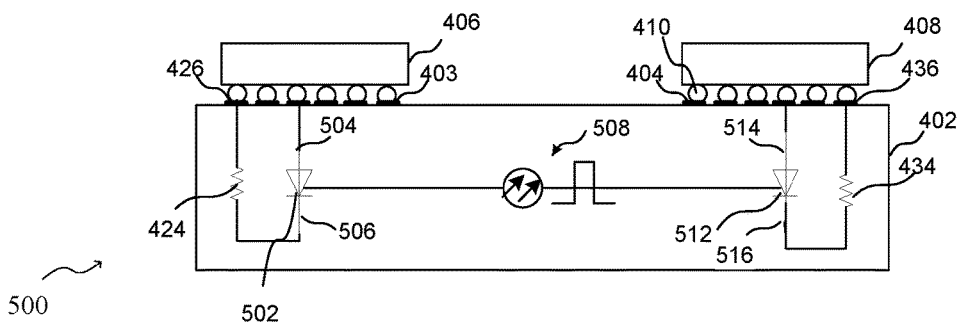
FIG. 5 is a cross-sectional view of an integrated circuit device having a photonics modulator and detector.

According to the implementation of FIG. 5, a cross-sectional view of an integrated circuit device 500 having a photonics modulator and detector is shown. More particularly, the implementation of the substrate of FIG. 5 comprises a diode 502, which may be implemented by a PN junction as described in reference to FIG. 6. The diode 502 comprises a first node 504 coupled to the die 406 and a second node 506 coupled to the ESD protection element 424. Signals generated by the diode 502 are coupled by way of a transmission channel 508 to a diode 512 having a first node 514 coupled to the die 408 and a second node 516 coupled to the ESD protection element 434.

According to one implementation, which will be described in more detail in reference to FIG. 6, the transmission channel may be provided by way of an optical link, where data is first transferred from an electrical domain to an optical domain using an electro-optic modulator. The signal may be transmitted by varying at least one of the intensity and the phase of the optical carrier. According to one implementation, the transmission channel may be implemented using silicon photonics, where modulation is achieved by varying the density of free charge carriers. For example, modulators can consist of both forward-biased PIN diodes, which generally generate large phase-shifts, as well as of reverse-biased PN junctions. A PN junction may also be used in a detector for carrier extraction, where a germanium detector may be implemented as a receiver. The optical signal is typically converted back to the electrical domain using a semiconductor photodetector as a receiver.

Figure 6:
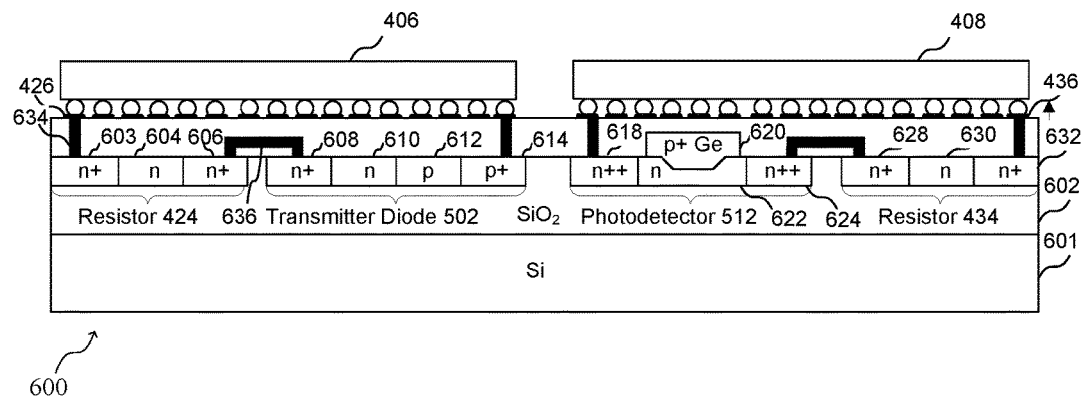
FIG. 6 is a cross sectional view showing elements formed in a substrate of the integrated circuit device of FIG. 6.

Turning now to FIG. 6, a cross sectional view shows elements of the integrated circuit device 600 according to the circuit configuration of FIG. 5. The embodiment of FIG. 6 comprises a substrate 601, shown here by way of example as a silicon substrate, having an oxide layer 602, shown here as a $SiO_2$ layer. Diffusion regions are formed in the oxide layer 602 to form the resistive element 424, the transmitter diode 502, the photodetector 512 and the resistive element 434. More particularly, the resistive element 424 comprises a heavily doped n-type (n+) region 603, a doped n-type (n) region 604, and another n+ region 606. The transmitter diode 502 comprises a n+ region 608, an n region 610, a doped p-type (p) region 612, and a heavily doped p-type (p+) region 614. The photo detector 512 comprises a more heavily doped n-type (n++) region 618, a p+ region in a well of a n region 622, and a n++ region 624. The resistive element 434 comprises a n+ region 628, a n region 630 and a n+ region 632. The heavily doped n+ and p+ regions provide contacts to TSVs, such as TSV 643 or other vias associated with metal traces 636, to enable the connections between the resistive element 424, the transmitter diode 502, the photodetector 512 and the resistor 434 and the dies 406 and 408. While the arrangement of the resistive element 424, the transmitter diode 502, the photodetector 512 and the resistive element 434 as shown in FIG. 6 is one example of an optical channel between the die 406 and the die 408, it should be understood that other arrangements of elements could be implemented to provide other optical channels or other a transmission channel.

Figure 7:
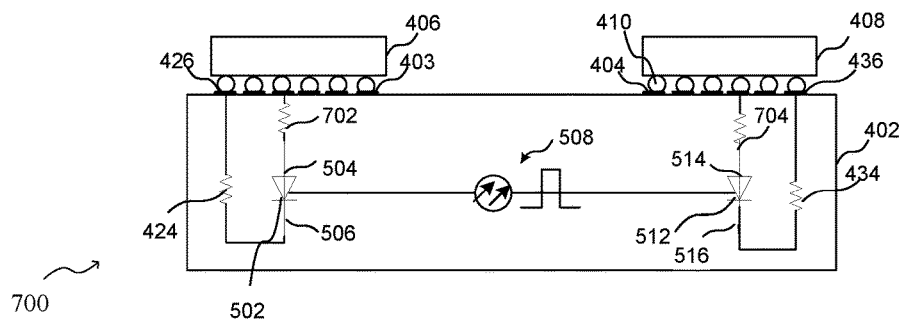
FIG. 7 is a cross-sectional view of another integrated circuit device having a photonics modulator and detector.

Turning now to FIG. 7, a cross-sectional view of another integrated circuit device 700 having a photonics modulator and detector is shown. According to the implementation of FIG. 7, resistors are provided with both contact elements associated with the transmitter and receiver coupled to the dies 406 and 408. According to the implementation of FIG. 7, a resistive element 702 is coupled between the die 406 and the input 504 of the diode 506, a resistive element 704 is coupled between the die 408 and the input 514 of the diode 512. The additional resistive elements 702 and 704 could be implemented in a similar manner as resistive element 424 and 434 as described in reference to FIGS. 4-6, and may provide additional ESD protection.

The values of the resistors 424 and 434 are selected to provide ESD protection, where higher values for the resistance would lead to greater ESD protection. However, higher resistance values for resistors 424 and 434 can adversely affect the performance of the integrated circuit device. Therefore, it is beneficial to select a value of the resistors 424 and 434 to provide ESD protection without adversely affecting performance of a circuit for transmitting data between the IC dies as described in FIGS. 4 and 5 for example. According to one implementation, the resistors 424 and 434 could be approximately 5-20 Ohms. In the implementation of FIG. 7, the approximate 5-20 Ohms could be distributed between the two resistors 424 and 702 associated with the transmitter and resistors 434 and 704 associated with the receiver. The ESD protection at the contact pad between an IC die and the substrate, such as the interposer, can be determined based upon the impedance of the IC die, such as a CMOS die, and the impedance of resistor 424 and 434 of the substrate. The termination impedance ($Z_T$) at the contact element is determined by the impedance of the IC die ($Z_{DIE}$) and the impedance of the substrate ($Z_{SUB}$) receiving the IC die, where $Z_T = Z_{DIE} + Z_{SUB}$ and $Z_{SUB}$ is affected by the impedance of resistor 424 and 434 of the substrate.

It should be noted that ESD protection is determined based upon two models, including a Charged-Device Model (CDM) and a Human-Body Model (HBM). When assembling a die assembly with an interposer as shown in FIG. 3, only ESD events associated with CDM can physically occur. A CDM current source has about 1 Ohm impedance. Therefore, a 10 Ohm resistor in the substrate is expected to reduce a CDM peak current by factor of 10. Because 3D die automation is automated and human interaction with the die is eliminated, HDM discharge would not occur at the node between the die and the substrate as shown in the die assembly of FIG. 3.

Figure 8:
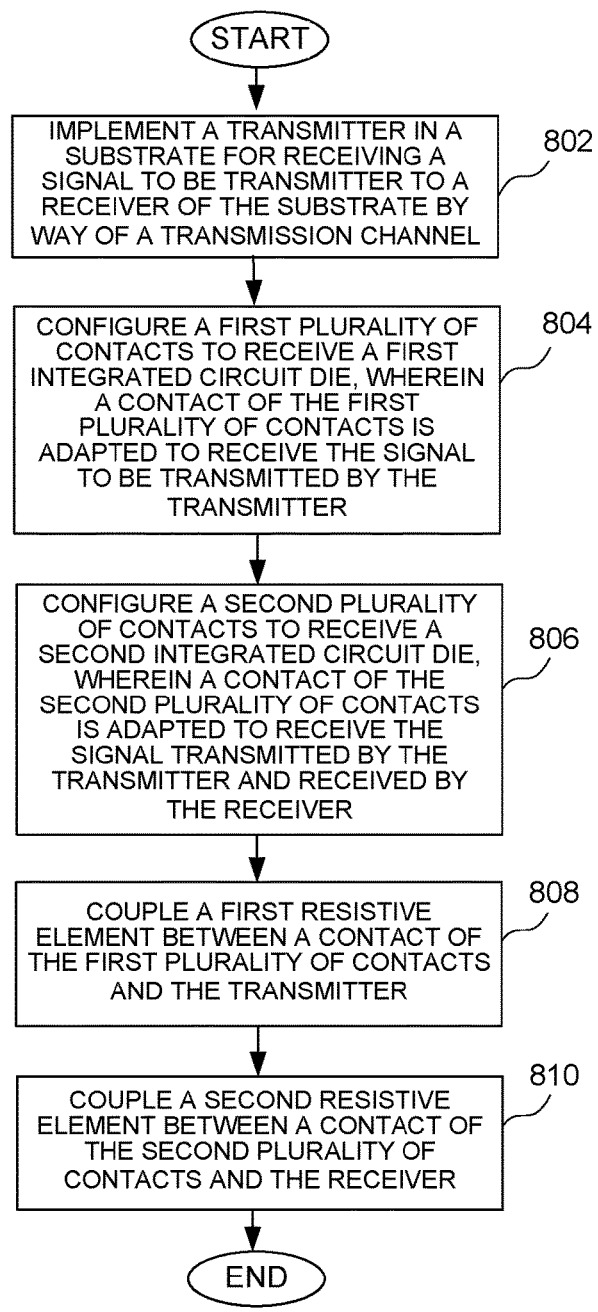
FIG. 8 is a flow diagram showing a method of transmitting data in an integrated circuit device.

Turning now to FIG. 8, a flow diagram showing a method of implementing an integrated circuit device. A transmitter, such as transmitter 412 or 502 for example, is implemented in a substrate for receiving a signal to be transmitter to a receiver of the substrate by way of a transmission channel at a block 802. A first plurality of contacts, such as contacts 403, is configured to receive a first integrated circuit die at a block 804, wherein a contact of the first plurality of contacts is adapted to receive the signal to be transmitted by the transmitter. A second plurality of contacts, such as contacts 404, is configured to receive a second integrated circuit die at a block 806, wherein a contact of the second plurality of contacts is adapted to receive the signal transmitted by the transmitter and received by the receiver. A first resistive element, such as resistive element 424, is coupled between a contact of the first plurality of contacts and the transmitter at a block 808. A second resistive element, such as resistive element 434, is coupled between a contact of the second plurality of contacts and the receiver at a block 810.

According to one implementation, the method may further comprise configuring a second plurality of contacts adapted to provide signals external to the integrated circuit device. According to some implementations, the substrate may comprise an interposer or a substrate of an integrated circuit package. According to other implementations, the substrate may comprise an optical interposer, and the transmission channel comprises an optical waveguide, such as a silicon waveguide. The transmitter may comprise a silicon modulator and the receiver may comprise a germanium photodetector. At least one of the first resistive element and the second resistive element comprises a resistive element formed in the substrate. A least one of the first resistive element and the second resistive element comprises a resistive element having a metal structure. According to some implementations, the resistive elements are selected to withstand an electrostatic discharge at the first contact and at the second contact, where the resistive elements may be adapted to withstand an approximately 100 mA, 100 ns electrostatic discharge pulse.

The method of FIG. 8 may be implemented using the circuits of FIGS. 1-7 as described, or may use some other suitable circuits. While specific elements of the method are described, it should be understood that additional elements of the method, or additional details related to the elements, could be implemented according to the disclosure of FIGS. 1-7.

It can therefore be appreciated that new systems for and methods of implementing an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. An integrated circuit device comprising:
   a substrate having a transmitter for receiving a signal to be transmitted to a receiver of the substrate by way of a transmission channel;
   a first plurality of contacts adapted to receive a first integrated circuit die, wherein a contact of the first plurality of contacts is adapted to receive the signal to be transmitted by the transmitter;
   a second plurality of contacts adapted to receive a second integrated circuit die, wherein a contact of the second plurality of contacts is adapted to receive the signal transmitted by the transmitter and received by the receiver;
   a first resistive element coupled between a first contact of the first plurality of contacts and the transmitter, wherein the first contact is coupled to ground; and
   a second resistive element coupled between a second contact of the second plurality of contacts and the receiver, wherein the second contact is coupled to ground.

2. The integrated circuit device of claim 1, further comprising a third plurality of contacts adapted to provide signals external to the integrated circuit device.

3. The integrated circuit device of claim 1, wherein the substrate comprises an interposer or a substrate of an integrated circuit package.

4. The integrated circuit device of claim 1, wherein the substrate comprises an optical interposer, and the transmission channel comprises an optical waveguide.

5. The integrated circuit device of claim 4, wherein the optical waveguide comprises a silicon waveguide.

6. The integrated circuit device of claim 5, wherein the transmitter comprises a silicon modulator and the receiver comprises a germanium photodetector.

7. The integrated circuit device of claim 1, wherein at least one of the first resistive element and the second resistive element comprises a resistive element formed in the substrate.

8. The integrated circuit device of claim 1, wherein at least one of the first resistive element and the second resistive element comprises a resistive element having a metal structure.

9. The integrated circuit device of claim 1, wherein the first resistive element and the second resistive element are implemented to provide an increased impedance to reduce an effect of an electrostatic discharge.

10. The integrated circuit device of claim 1, wherein the first resistive element and the second restive element have resistance values within a range of 5 to 20 Ohms.

11. A method of transmitting data in an integrated circuit device, the method comprising:
    implementing a transmitter in a substrate for receiving a signal to be transmitted to a receiver of the substrate by way of a transmission channel;
    configuring a first plurality of contacts to receive a first integrated circuit die, wherein a contact of the first plurality of contacts is adapted to receive the signal to be transmitted by the transmitter;
    configuring a second plurality of contacts to receive a second integrated circuit die, wherein a contact of the second plurality of contacts is adapted to receive the signal transmitted by the transmitter and received by the receiver;
    coupling a first resistive element between a first contact of the first plurality of contacts and the transmitter, wherein the first contact is coupled to ground; and
    coupling a second resistive element between a second contact of the second plurality of contacts and the receiver, wherein the second contact is coupled to ground.

12. The method of claim 11, further comprising configuring a third plurality of contacts adapted to provide signals external to the integrated circuit device.

13. The method of claim 11, wherein the substrate comprises an interposer or a substrate of an integrated circuit package.

14. The method of claim 11, wherein the substrate comprises an optical interposer, and the transmission channel comprises an optical waveguide.

15. The method of claim 14, wherein the optical waveguide comprises a silicon waveguide.

16. The method of claim 15, wherein the transmitter comprises a silicon modulator and the receiver comprises a germanium photodetector.

17. The method of claim 11, wherein at least one of the first resistive element and the second resistive element comprises a resistive element formed in the substrate.

18. The method of claim 11, wherein at least one of the first resistive element and the second resistive element comprises a resistive element having a metal structure.

19. The method of claim 11, wherein the first resistive element and the second resistive element are implemented to provide an increased impedance to reduce an effect of an electrostatic discharge.

20. The method of claim 11, wherein the first resistive element and the second resistive element have resistance values within a range of 5 to 20 Ohms.

* * * * *